(12) United States Patent
Lee et al.

(10) Patent No.: US 8,675,757 B2
(45) Date of Patent: Mar. 18, 2014

(54) DIGITAL TELEVISION TRANSMITTING/RECEIVING SYSTEM AND METHOD OF PROCESSING DIGITAL BROADCAST DATA IN DIGITAL TELEVISION TRANSMITTING/RECEIVING SYSTEM

(75) Inventors: Hyoung Gon Lee, Seoul (KR); In Hwan Choi, Gyeonggi-do (KR); Kook Yeon Kwak, Gyeonggi-do (KR); Byoung Gill Kim, Seoul (KR); Jong Moon Kim, Gyeonggi-do (KR); Woo Chan Kim, Gyeonggi-do (KR); Jae Hyung Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 2220 days.

(21) Appl. No.: 11/612,365

(22) Filed: Dec. 18, 2006

(65) Prior Publication Data

US 2007/0140257 A1     Jun. 21, 2007

Related U.S. Application Data

(60) Provisional application No. 60/867,460, filed on Nov. 28, 2006.

(30) Foreign Application Priority Data

Dec. 19, 2005   (KR) .................. 10-2005-0125609

(51) Int. Cl.
   *H04L 23/02*   (2006.01)
(52) U.S. Cl.
   USPC .......................................... 375/265; 375/267
(58) Field of Classification Search
   None
   See application file for complete search history.

(56) References Cited

U.S. PATENT DOCUMENTS

| | | | | |
|---|---|---|---|---|
| 7,675,994 | B2* | 3/2010 | Gaddam et al. | 375/301 |
| 8,094,727 | B2* | 1/2012 | Hong et al. | 375/240.25 |
| 2002/0159520 | A1 | 10/2002 | Choi et al. | |
| 2002/0186790 | A1 | 12/2002 | Choi et al. | |
| 2002/0194570 | A1* | 12/2002 | Birru et al. | 714/792 |
| 2004/0090997 | A1 | 5/2004 | Choi et al. | |
| 2005/0111586 | A1* | 5/2005 | Kang et al. | 375/321 |
| 2010/0100793 | A1* | 4/2010 | Limberg | 714/756 |

FOREIGN PATENT DOCUMENTS

| | | |
|---|---|---|
| KR | 1020050049923 | 5/2005 |
| KR | 1020050058741 | 6/2005 |
| KR | 1020050111535 | 11/2005 |
| WO | WO 2005-109878 A1 | 11/2005 |

* cited by examiner

*Primary Examiner* — Hassan Phillips
*Assistant Examiner* — Mark A Mais
(74) *Attorney, Agent, or Firm* — Lee, Hong, Degerman, Kang & Waimey

(57) ABSTRACT

A digital television (DTV) transmitting/receiving system and a method of processing digital broadcast data in the DTV transmitting/receiving system are disclosed. The DTV transmitting system includes a randomizer for randomizing enhanced data, an encoder for encoding each bit of the randomized enhanced data at a coding rate of ½ in order to output data symbols, a symbol to byte converter for converting the data symbols to data bytes, a deinterleaver for deinterleaving the data bytes, a Reed-Solomon (RS) encoder for RS-coding enhanced data packets including the deinterleaved data bytes to add RS parity data, a data interleaver for interleaving data of the RS-coded enhanced data packets, a trellis encoder for trellis coding the interleaved data at a coding rate of ⅔, and a transmitting unit for transmitting a digital broadcast signal including the trellis-encoded data.

8 Claims, 10 Drawing Sheets

M : Main Data Symbol
T : Known Data Symbol
E : Enhanced Data Symbol

DIGITAL TELEVISION TRANSMITTING/RECEIVING SYSTEM AND METHOD OF PROCESSING DIGITAL BROADCAST DATA IN DIGITAL TELEVISION TRANSMITTING/RECEIVING SYSTEM This application claims the benefit of earlier filing date and right of priority to Korean Patent Application No. 10-2005-0125609, filed on Dec. 19, 2005, and also claims the benefit of U.S. Provisional Application No. 60/867,460, filed on Nov. 28, 2006, the contents of all of which are hereby incorporated by reference herein in their entireties.

BACKGROUND OF THE INVENTION

1. Field of the Invention

The present invention relates to a digital telecommunications system, and more particularly, to a digital broadcast transmitting/receiving system and a method of processing data that are used for transmitting and receiving digital broadcast programs.

2. Discussion of the Related Art

The Vestigial Side Band (VSB) transmission mode, which is adopted as the standard for digital broadcasting in North America and the Republic of Korea, is a system that has been developed for the transmission of Moving Picture Experts Group (MPEG) video/audio data. However, presently, the technology for processing digital signals is being developed at a vast rate, and, as a larger number of the population uses the Internet, digital electric appliances, computers, and the Internet are being integrated. Therefore, in order to meet with the various requirements of the users, a system that can transmit video/audio data as well as other diverse supplemental information through a digital television channel needs to be developed.

Some users may assume that supplemental data broadcasting would be applied by using a personal computer (PC) card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the MPEG video/audio data. However, with the advent of digital broadcasting, ATSC VSB digital television receivers that receive only MPEG video/audio data are already supplied to the market. Therefore, the supplemental data that are transmitted through the same channel as the MPEG video/audio data should not influence the conventional ATSC VSB receivers that are provided in the market. In other words, this may be defined as ATSC VSB compatibility, and the supplemental data broadcast system should be compatible with the ATSC VSB system. Herein, the supplemental data may also be referred to as enhanced data or enhanced VSB (EVSB or E-VSB) data. Furthermore, in a poor channel environment, the receiving performance of the conventional ATSC VSB receiving system may be deteriorated. More specifically, resistance to changes in channels and noise is more highly required when using portable and/or mobile receivers.

SUMMARY OF THE INVENTION

Accordingly, the present invention is directed to a digital broadcast transmitting/receiving system and a method of processing data that substantially obviate one or more problems due to limitations and disadvantages of the related art.

An object of the present invention is to provide a digital broadcast transmitting/receiving system that is suitable for transmitting supplemental data and that is highly resistant to noise.

Another object of the present invention is to provide a digital broadcast transmitting/receiving system and a method of processing data that can insert known data in a specific domain of the supplemental data and transmitting the data to a digital broadcast transmitter/receiver, thereby enhancing the receiving performance of the digital broadcast system.

A further object of the present invention is to provide a coding method for enhancing the efficiency in transmitting enhanced data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitter includes a pre-processor, a data formatter, a multiplexer, a data randomizer, an RS encoder, a data interleaver, a byte-symbol converter, and a symbol processor. The pre-processor pre-processes original enhanced data by expanding the original enhanced data at an expansion rate of N/M, where N and M are positive integers and N<M. For example, the pre-processor may expand the original enhanced data by adding a repetition bit or a null bit into every three bits of the original enhanced data. The data formatter generates enhance data packets including the expanded enhanced data and inserts known data into at least one of the enhanced data packets. Thereafter, the multiplexer multiplexes the enhanced data packets with main data packets which include main data. The data randomizer randomizes the multiplexed enhanced and main data packets, and the RS encoder RS-encodes the randomized data packets by adding RS parity data. The data interleaver interleaves the RS-coded data packets. The byte-symbol converter converts the interleaved data packets into corresponding symbols.

Finally, the symbol processor processes the converted symbols. The symbol processor encodes symbols representing the original enhanced data at a rate of N/M. The symbol processor may further remove symbols representing the repetition bit or null bit added by the pre-processor.

In one example, the symbol processor may include a pre-puncturing formatter, a ½ rate encoder, and a puncturer. The pre-puncturing formatter removes symbols representing the null or repetition data added by the pre-processor. The ½ rate encoder encodes the symbols representing the original enhanced data at an encoding rate ½. The puncturer punctures the encoded enhanced data symbols at a puncturing rate of ⅔ using a puncturing mask.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, weather forecast, and so on, or consist of video/audio data. Additionally, the known data refer to data already known based upon a pre-determined agreement between the transmitter and the receiver. Furthermore, the main data consist of data that can be received from the conventional receiving system, wherein the main data include video/audio data.

The present invention relates to inserting known data known by the transmitter/receiver in a specific domain of an enhanced data packet and transmitting the processed data packet, thereby enhancing the receiving performance of the receiving system. Finally, by performing additional coding processes on the enhanced data, the present invention can provide a more excellent receiving performance against noise generated from channels, as opposed to the main data, and interference caused by multiple paths, thereby enhancing the transmission efficiency.

Figure 1:
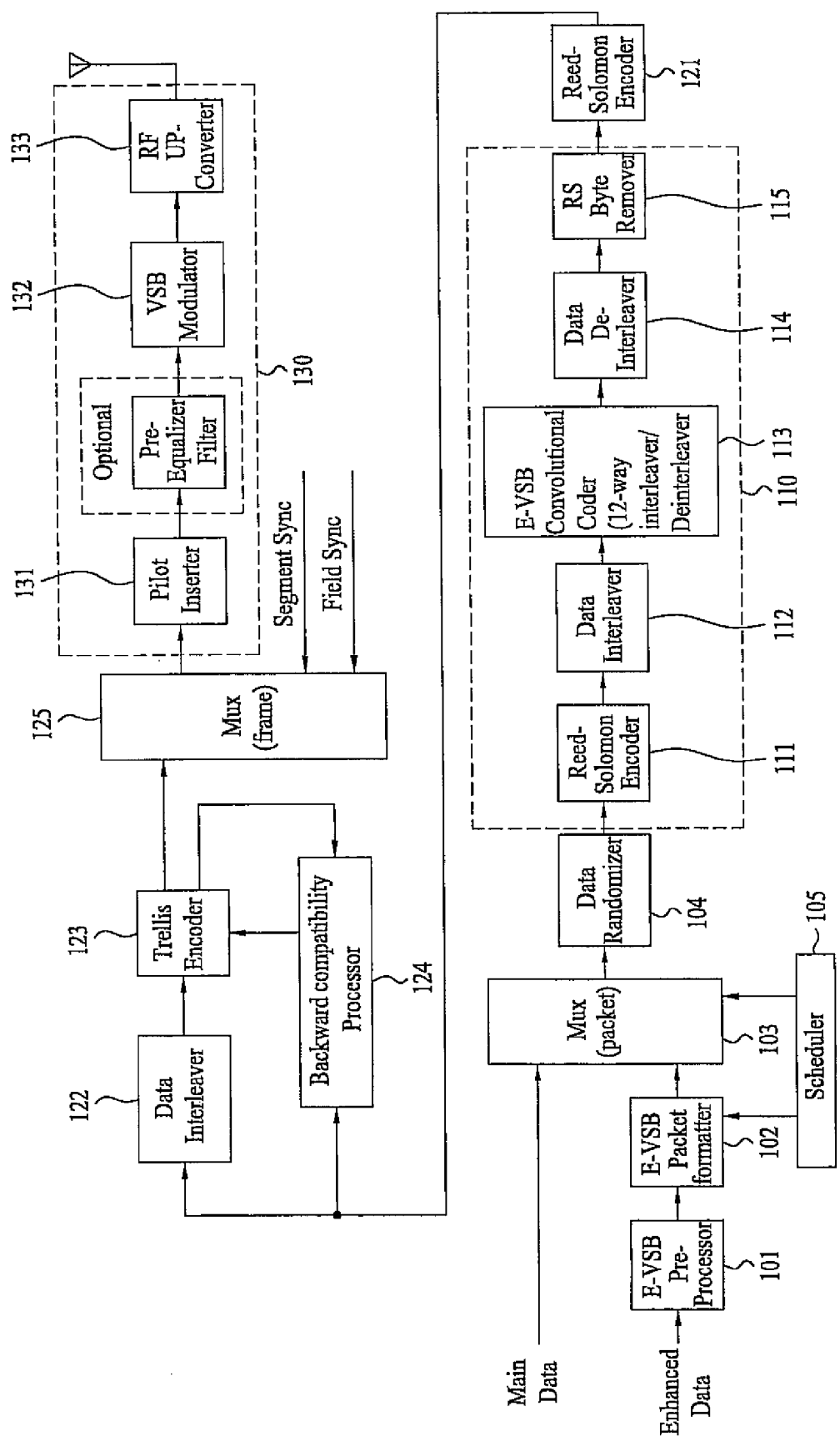
FIG. 1 illustrates a block view of a digital broadcast transmitting system according to the present invention.

FIG. 1 illustrates a block view of a digital broadcast transmitting system according to the present invention. The digital television receiver includes an E-VSB pre-processor 101, an E-VSB packet formatter 102, a packet multiplexer 103, a data randomizer 104, a scheduler 105, an E-VSB post-processor 110, a Reed-Solomon (RS) encoder 121, a data interleaver 122, a trellis encoder 123, a backward compatibility processor 124, a frame multiplexer 125, and a transmitter 130. In the present invention having the above-described structure, main data are outputted to the packet multiplexer 103 in transport stream (TS) packet units, and enhanced data are outputted to the E-VSB pre-processor 101. The E-VSB pre-processor 101 pre-processes the enhanced data, such as encoding additional error correction, interleaving, and expanding data bytes by inserting null data, and then outputs the pre-processed enhanced data to the E-VSB packet formatter 102.

Figure 2:
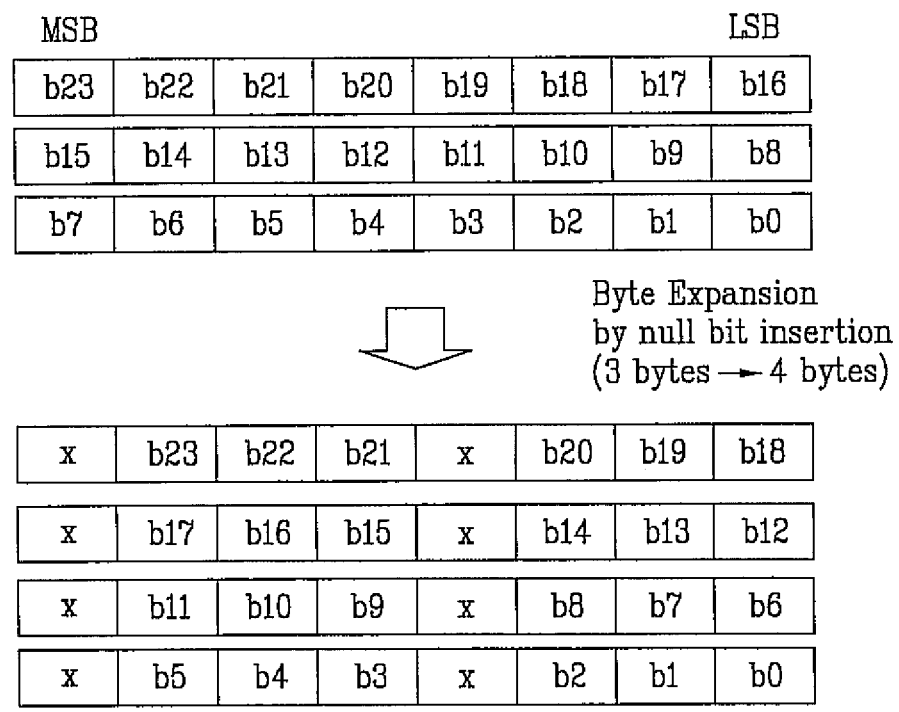
FIG. 2 illustrates an example of expanding three enhanced data bytes to four data bytes according to the present invention.

A wide range of examples may be given for the byte expansion performed by inserting null data bytes. An example of performing byte expansion at a coding rate of ¾ will be given in the description of the present invention. The byte expansion process includes a method of inserting at least one null data byte before or after each set of at least one bit, and a method of adding bits by repeating a set of at least one bit. Referring to FIG. 2, the example of the byte expansion process according to the present invention consists of inserting a null bit so as to expand three enhanced data bytes to four enhanced data bytes. More specifically, one null bit (x) is inserted after each set of three bits of the enhanced data byte, so as to expand the three enhanced data bytes to four enhanced data bytes. However, the process of expanding three enhanced data bytes to four enhanced data bytes is only one of many possible examples of byte expansion. Therefore, the present invention is not limited only to the example set forth in the description of the present invention.

Based upon the control of the scheduler 105, the E-VSB packet formatter 102 multiplexes the pre-processed enhanced data and the pre-defined known data (or the known data place holder), thereby configuring a group. The data within the group are then divided into 184-byte unit enhanced data packets, and a 4-byte MPEG header is added to the beginning of the enhanced data packet, thereby outputting a 188-byte enhanced data packet (i.e., a MPEG compatibility packet). In other words, one enhanced data packet group includes a plurality of consecutive enhanced data packets. The output of the E-VSB packet formatter 102 is inputted to the packet multiplexer 103. The packet multiplexer 103 time-division multiplexes the main data packet and the enhanced data packet group in transport stream (TS) packet units and outputs the multiplexed TS packet in accordance with the control of the scheduler 105. More specifically, the scheduler 105 generates and outputs a control signal so that the packet formatter 102 can multiplex the enhanced data and the main data. The scheduler 105 also generates and outputs a control signal so that the packet multiplexer 103 can multiplex the main data packet and the enhanced data packet group. Accordingly, the packet multiplexer 103 receives the control signal, thereby multiplexing and outputting the main data packet and the enhanced data packet group to TS packet units.

According to an embodiment of the present invention, the known data and the enhanced data are multiplexed by the E-VSB packet formatter 102. Additionally, according to another embodiment of the present invention, the E-VSB packet formatter 102 decides a known data place holder in which known data are to be inserted, and then the E-VSB packet formatter 102 inserts null data in the decided known data place holder. Thereafter, the inserted null data may be multiplexed with the enhanced data pre-processed by the E-VSB pre-processor 101. The actual known data are generated in a later process, which then replace the null data inserted in the known data place holder.

Meanwhile, the output data of the packet multiplexer 103 are inputted to the data randomizer 104. The data are then randomized and provided to the E-VSB post-processor 110. Herein, the E-VSB post-processor 110 includes a RS encoder 111, a data interleaver 112, an E-VSB convolution encoder 113, a data deinterleaver 114, and a RS byte remover 115. The RS encoder 111 RS encodes the output data of the data randomizer 104, so as to add a set of 20-byte parity data to the output data. Thereafter, the parity-added data pass through the data interleaver 112 so as to be provided to the E-VSB convolutional encoder 113.

The E-VSB convolutional encoder 113 converts the inputted byte to a symbol, thereby convolution-coding only the enhanced data symbol. Then, the E-VSB convolutional encoder 113 converts the symbols back to a byte which is then outputted. More specifically, when the output of the data interleaver 112 corresponds to the main data, or when the output of the data interleaver 112 corresponds to the known data inserted in the enhanced data packet, the E-VSB convolutional encoder 113 outputs the data without any modification. Additionally, the E-VSB convolutional encoder 113 also outputs the MPEG header byte added by the E-VSB packet formatter 102 or the RS parity byte added to the enhanced data packet by the RS encoder 111 without any modification. The output of the E-VSB convolutional encoder 113 is deinterleaved from the data deinterleaver 114 and then outputted to the RS parity remover 114, thereby removing the 20-byte parity data. This operation is performed in order to recalculate the parity since the original (or initial) data have been modified by the E-VSB convolutional encoder 113. The output of the RS byte remover 115 is then outputted to the RS encoder 121.

The RS encoder 121 performs a RS-coding process identical to that of the conventional ATSC VSB system on the input data, thereby adding a 20-byte parity at the end of the 187-byte data. Then, the RS encoder 121 outputs the parity added input data to the data interleaver 122 and the backward compatibility processor 124. The data interleaver 122 interleaves the input data. Herein, the same data interleaving rules as those of the data interleaver 112 are applied. The output of the data interleaver 122 is inputted to the trellis encoder 123. Then, the trellis encoder 123 encodes and outputs the inputted 2 bits to 3 bits. Thereafter, the encoded 3 bits are outputted to the frame multiplexer 125. In other words, the output of the trellis encoder 123 is inputted to the frame multiplexer 125. The frame multiplexer 125 inserts a field synchronization signal and a segment synchronization signal to the output of the trellis encoder 123 and, then, outputs the processed data to the transmitter 130. Herein, the transmitter 130 includes a pilot inserter 131, a VSB modulator 133, and a radio frequency (RF) converter 134. The role of the transmitter 130 is identical to that of the conventional VSB transmitter. Therefore, a detailed description of the transmitter 130 will be omitted for simplicity.

Meanwhile, in order to assign the data outputted from the trellis encoder 123 as the known data defined by the transmitter/receiver, the memory within the trellis encoder 123 should first be initialized, the data of which correspond to the known data inserted to the enhanced data packet. In order to perform the initialization process of the memory, the input of the trellis encoder 123 should be replaced. Then, the RS parity that is influenced by the data changed in accordance to the replacement is recalculated so as to replace the initial parity data. This process is performed by the backward compatibility processor 124.

More specifically, when the interleaved data being inputted to the trellis encoder 123 correspond to the known data, and when the known data correspond to the beginning of the known data column, to which data are consecutively inputted, the memory of the trellis encoder 123 needs to be initialized. Since a memory is included in the trellis encoder 123, and since the current output is influenced not only by the current input but also by a past input, the memory of the current trellis encoder 123 should be initialized to a predetermined value, so that a pre-decided signal can be outputted at a particular moment (or point). Furthermore, since the memory of the trellis encoder 123 is initialized by a new set of data, and not by the data interleaved by the data interleaver 122, a new set of RS parity should be created so as to replace the initial set of parity data. This process is also performed by the backward compatibility processor 124.

Figure 3:
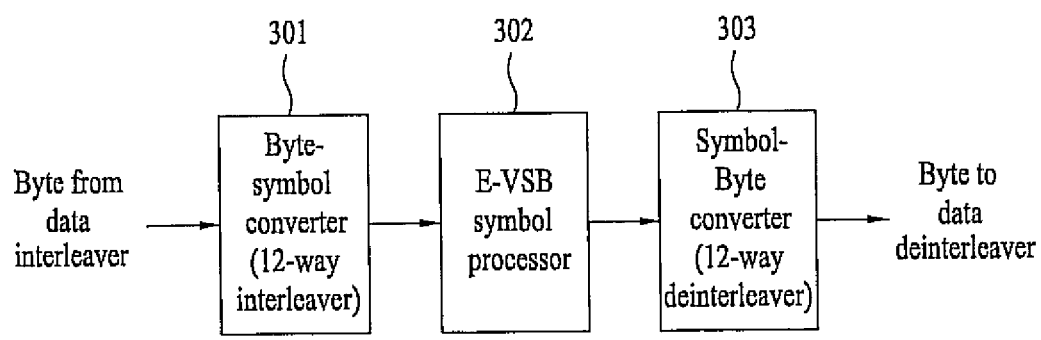
FIG. 3 illustrates an E-VSB convolutional encoder according to an embodiment of the present invention.
Figure 4:
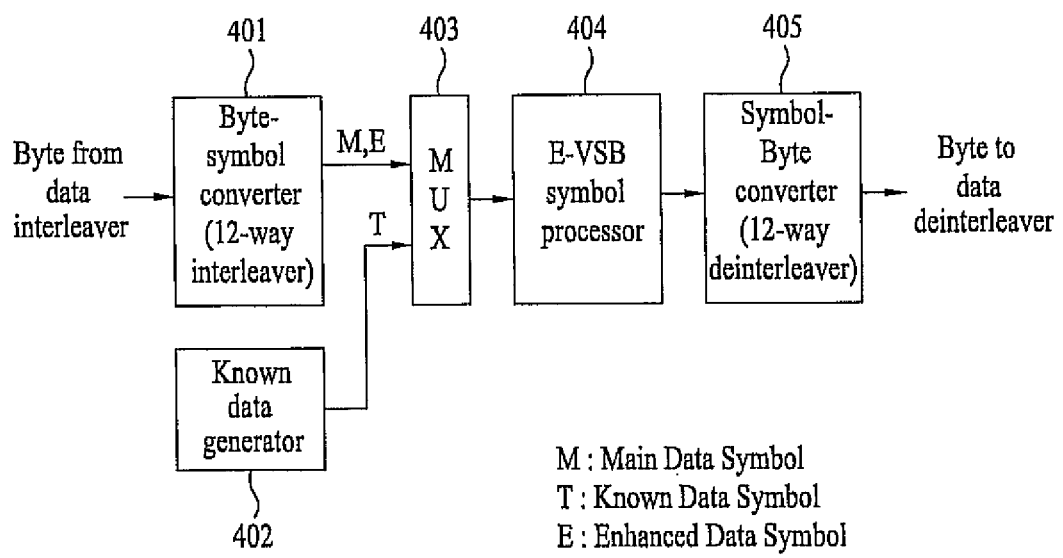
FIG. 4 illustrates an E-VSB convolutional encoder according to another embodiment of the present invention.

FIG. 3 and FIG. 4 respectively illustrate E-VSB convolutional encoders according to preferred embodiments of the present invention. Referring to FIG. 3, the E-VSB convolutional encoder includes a byte-symbol converter (or 12-way interleaver) 301, an E-VSB symbol processor 302, and a symbol-byte converter (or 12-way deinterleaver) 303. The byte-symbol converter 301 converts the byte, which is interleaved and outputted from the data interleaver 112, to symbols and outputs the symbols to the E-VSB symbol processor 302. At this point, one byte is converted to 4 symbols, and one symbol is configured of 2 bits.

The E-VSB symbol processor 302 performs a coding process only on the enhanced data symbol. On the other hand, the E-VSB symbol processor 302 directly outputs the main data symbol and the known data symbol without any modification. In addition, even when the MPEG header byte inserted in the enhanced data packet by the E-VSB packet formatter 102 and the RS parity byte added to the enhanced data packet by the RS encoder 111 are converted to symbols, the E-VSB symbol processor 302 directly outputs the symbols without any data modification. The output symbols of the E-VSB symbol processor 302 are converted to a byte by the symbol-byte converter 303 and then outputted. The byte-symbol converter 301 is identical to the byte-symbol converter (not shown) of the trellis encoder 123, and the symbol-byte converter 303 performs inverse operation of the byte-symbol converter 301.

In comparison with the E-VSB convolutional encoder of FIG. 3, the E-VSB convolutional encoder shown in FIG. 4 further includes a known data generator 402 and a multiplexer 403. Herein, the operations of the byte-symbol converter 401, the E-VSB symbol processor 404, and the symbol-byte converter 405 shown in FIG. 4 are identical to those of FIG. 3. Referring to FIG. 4, when the known data inserted by the E-VSB packet formatter 102 are outputted through the byte-symbol converter 401, the E-VSB convolutional encoder replaces the outputted known data with the known data symbol generated from the symbol domain. Then, the E-VSB convolutional encoder outputs the known data symbol to E-VSB symbol processor 404. More specifically, since the known data used by the receiving system are used in the symbol domain, it is more effective to create (or generate) a known data symbol sequence having the characteristics desired by the symbol domain. In this case, the known data inserted from the E-VSB packet formatter 102 act as a place holder for ensuring the place in which known data are to be inserted. In other words, the data that are inputted to the byte-symbol converter 401 correspond to a byte of the enhanced data packet having a known data place holder multiplexed thereto and the main data packet.

The data being converted to symbols from the byte-symbol converter 401 are outputted to the multiplexer 403. In addition, the known data T generated from the symbol domain are also outputted to the multiplexer 403. When the inputted symbol corresponds to a main data symbol or an enhanced data symbol, the multiplexer 403 selects the output of the byte-symbol converter 401. Alternatively, when the inputted symbol corresponds to a known data (or known data place holder) symbol, the multiplexer 403 selects the output of the known data generator 402. Thereafter, the multiplexer 403 outputs the selected symbol to the E-VSB symbol processor 404. The E-VSB symbol processor 404 performs a coding process only on the enhanced data symbol E. In case of the main data symbol M and the known data symbol T, the symbols are bypassed without being coded. At this point, the E-VSB symbol processor 404 also bypasses the MPEG header byte added by the E-VSB packet formatter 102 and the RS parity byte added to the enhanced data packet by the RS encoder 111 without coding the corresponding bytes. The symbol-byte converter 405 converts the output symbols of the E-VSB symbol processor 404 to a byte. Thereafter, the newly converted byte is outputted to the data deinterleaver 114.

Figure 5:
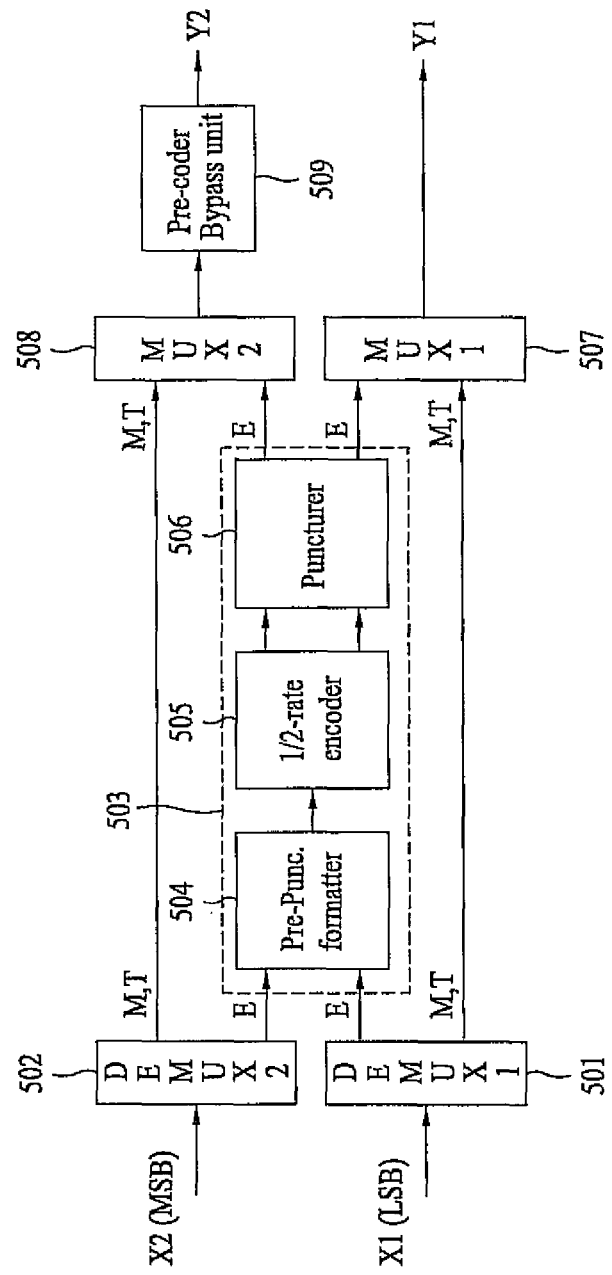
FIG. 5 illustrates a block view of an E-VSB symbol processor according to an embodiment of the present invention.

FIG. 5 illustrates a block view of an E-VSB symbol processor according to an embodiment of the present invention. The E-VSB symbol processor may be applied to the E-VSB convolutional encoder shown in FIG. 3 and FIG. 4. Referring to FIG. 5, X1 corresponds to the lower bit among the 2 bits of the symbol outputted from the byte-symbol converter, and X2 corresponds to the upper bit. M represents the main data symbol, T signifies the known data symbol, and E represents the enhanced data symbol. At this point, if the MPEG header byte inserted to the enhanced data packet and the parity byte inserted by the RS encoder are converted to symbols, the inserted bytes are processed as the main data symbol.

The E-VSB symbol processor of FIG. 5 includes first and second demultiplexers (DEMUX1 and DEMUX2) 501 and 502, an enhanced encoder 503, first and second multiplexers (MUX1 and MUX2) 507 and 508, and a pre-coder bypass 509. The enhanced encoder 503 includes a pre-puncture formatter 504, a ½-coding rate encoder (hereinafter referred to as a "½-rate encoder") 505, and a puncturer 506. Referring to FIG. 5, when the input bit X1 is a lower bit of a main data symbol M or a lower bit of a known data symbol T, the first demultiplexer 501 outputs the input bit X1 to the first multiplexer 507. Alternatively, when the input bit X1 is a lower bit of an enhanced data symbol E, the first demultiplexer 501 outputs the input bit X1 to the pre-puncture formatter 504 of the enhanced encoder 503. Similarly, when the input bit X2 is an upper bit of a main data symbol M or an upper bit of a known data symbol T, the second demultiplexer 502 outputs the input bit X2 to the second multiplexer 508. Alternatively, when the input bit X2 is an upper bit of an enhanced data symbol E, the second demultiplexer 502 outputs the input bit X2 to the pre-puncture formatter 504 of the enhanced encoder 503.

The enhanced encoder 503 is used for ¾-rate coding and outputting only the initial (or original) enhanced data among the enhanced data being outputted from the E-VSB pre-processor 101. In order to do so, among the enhanced data inputted from the first and second demultiplexers 501 and 502, the pre-puncture formatter 504 of the enhanced encoder 503 removes the null bits that have been inserted in the enhanced data by the E-VSB pre-processor 101. Thereafter, the pre-puncture formatter 504 outputs only the initial enhanced data bits to the ½-rate encoder 505. More specifically, the pre-puncture formatter 504 distinguishes the initial enhanced data symbol bits from the null bits which are inserted by the E-VSB pre-processor 101 in order to ensure the bits that are to be expanded at a ¾ coding rate. Subsequently, the pre-puncture formatter 504 only outputs the initial enhanced data symbol bits to the ½-rate encoder 505.

Figure 6:
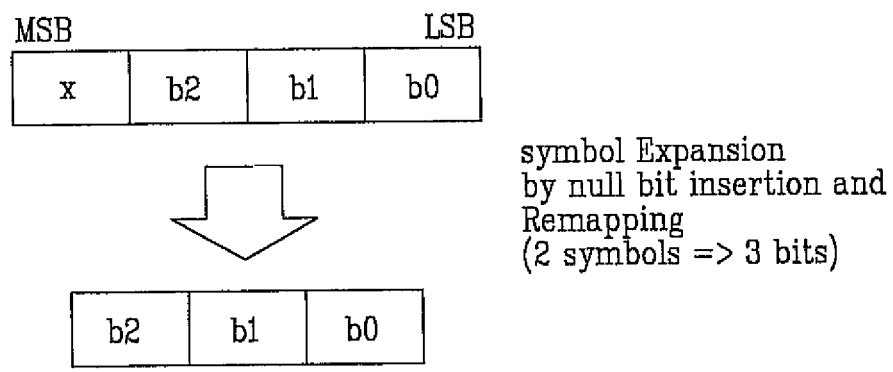
FIG. 6 illustrates exemplary operations of a pre-puncture formatter shown in FIG. 5.

FIG. 6 illustrates exemplary operations of the pre-puncture formatter 504. In the example shown in FIG. 6, the pre-puncture formatter 504 differentiates the null bits and the initial enhanced data symbol bits, so as to transmit only the bits of the initial enhanced data symbol. Since the null bit insertion rule of the E-VSB pre-processor 101 is known to the pre-puncture formatter 504, with the exception of the bit corresponding to the place of the null bit among the four bits, the pre-puncture formatter 504 outputs the remaining three bits to the ½-rate encoder 505. Herein, the remapping of the symbol is performed by receiving four bits of the enhanced data that have been expanded from three bytes to four bytes and by removing the null bit so as to output only the three remaining bits. And, in light of the ½-rate encoder 505, the remapping of the symbol, which corresponds to $\frac{3}{4} \times \frac{4}{3} = 1$, is the same as the symbol being directly transmitted (or outputted) without being modified. Therefore, in order to simplify the structure of the present invention, apart from the examples shown in FIG. 2 and FIG. 6, many other methods having a coding rate of ¾ in order to transmit only the enhanced data bits to the ½-rate encoder 505 may be applied to the present invention. Accordingly, many other symbol remapping methods for extracting only the enhanced data bits may also be proposed.

Meanwhile, the ½-rate encoder 505 performs a coding process on one of the enhanced data bits outputted from the pre-puncture formatter 504, thereby outputting two bits. Herein, any type of encoder that can receive one bit and process the received bit, thereby outputting two bits, may be used as the ½-rate encoder 505. For example, any one of a ½-rate systematic convolutional encoder, a ½-rate non-systematic convolutional encoder, a ½-rate repetition encoder, and a ½-rate inversion encoder may be used as the ½-rate encoder 407. However, the type of encoder that may be used is not limited only to the examples mentioned above. The output of the ½-rate encoder 505 is inputted to the puncturer 506 so as to be punctured at a rate of 3⁄2.

The puncturer 506 removes the symbol data, which has been expanded by the ½-rate encoder 505 at a coding rate of ½, at a puncturing rate of 3⁄2 (i.e., receiving 3 symbols and outputting 2 symbols). Accordingly, the overall coding rate of the E-VSB symbol processor 404 is increased from ½ to ¾, thereby enhancing the transmission efficiency. More specifically, the outputs of the encoder 505 having the coding rate of ½ passes through the puncturer 506 having the puncturing rate of 3⁄2, which corresponds to $\frac{1}{2} \times \frac{3}{2} = \frac{3}{4}$. Thus, the overall coding rate of the enhanced data being outputted from the E-VSB symbol processor 404 becomes ¾.

Figure 7:
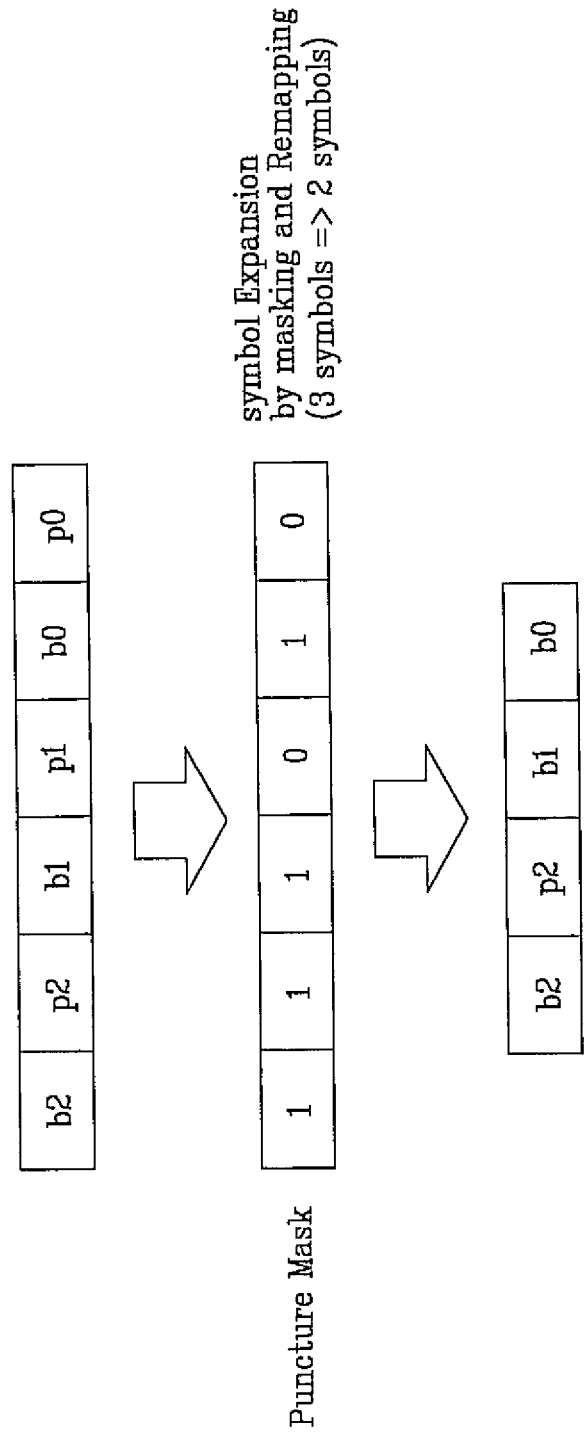
FIG. 7 illustrates exemplary operations of a puncturer shown in FIG. 5.

FIG. 7 illustrates exemplary operations of the puncturer. Referring to FIG. 7, b* indicates that the bit inputted to the ½-rate encoder 505 corresponds to the enhanced data bit that has been directly inputted without modification. And, p* indicates a parity bit generated (or created) by encoding the b* bit from the ½-rate encoder 505. The puncturer 506 groups the output symbols by 3-symbol units and compares the grouped symbols with a puncture mask. Accordingly, as the puncture mask outputs the data bits corresponding to '1', the number of symbols is reduced from 3 to 2. In other words, a symbol reduction is performed from 3 symbols to 2 symbols. Herein, as described in the example of the present invention, the method of using the puncture mask may include any of the instances wherein only two of six bits correspond to '0' and the remaining four bits corresponds to '1'.

The lower bit of the output symbol outputted from the puncturer 506 is outputted to the symbol-byte converter through the first multiplexer 507 as the lower bit Y1. On the other hand, the upper bit of the output symbol outputted from the puncturer 506 is outputted to the symbol-byte converter through the second multiplexer 508 and the pre-coder bypass 509 as the upper bit Y2. More specifically, when the input symbol is the enhanced data symbol E, the first multiplexer 507 selects a lower output bit of the puncturer 506 in the enhanced encoder 503. Alternatively, when the input symbol is the main data symbol M or the known data symbol T, the first multiplexer 507 selects the output bit X1 of the first demultiplexer 501. Thereafter, the selected output bit is outputted to the symbol-byte converter as the lower bit Y1.

Furthermore, when the input symbol corresponds to the main data symbol M or the known data symbol T, the second multiplexer 508 selects the output bit X2 of the second demultiplexer 502. Conversely, when the input symbol corresponds to the enhanced data symbol E, the second multiplexer 508 selects the upper output bit of the puncturer 506 included in the enhanced encoder 503. Thereafter, the second multiplexer 508 outputs the selected output bit to the pre-coder bypass 509.

Figure 8A:
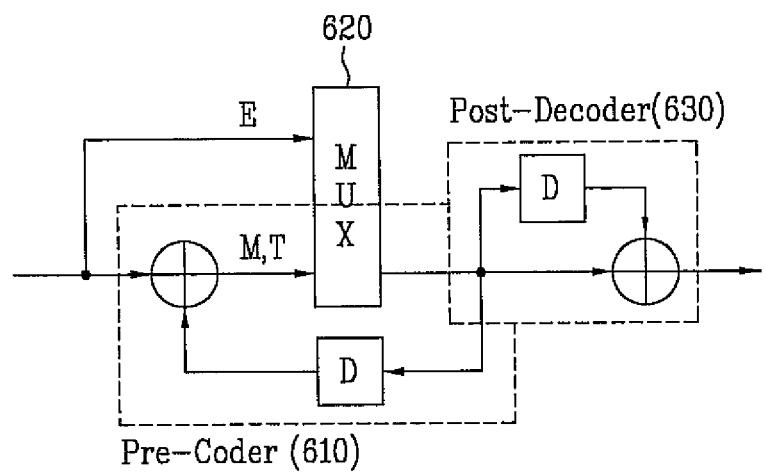
FIG. 8A and FIG. 8B illustrate block views of a pre-coder bypass shown in FIG. 5.
Figure 8B:
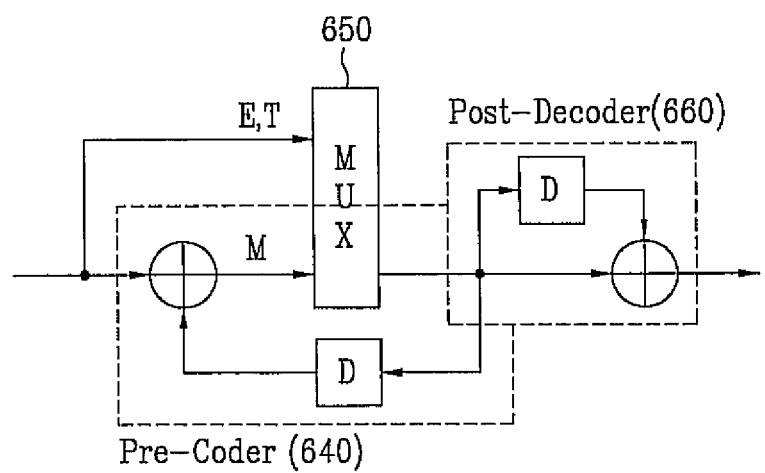

FIG. 8A and FIG. 8B illustrate block views of a pre-coder bypass. Referring to FIG. 8A, the pre-coder bypass according to the present invention includes a pre-coder 610, a multiplexer 620, and a post-decoder 630. Herein, the post-decoder 630 performs an inverse process of the pre-coder 610. The multiplexer 620 selects either an input bit or an output bit of the pre-coder 610 in accordance with the input data symbol type. Then, the multiplexer 620 outputs the selected input bit or output bit to the post-decoder 630. If the input data is an enhanced data symbol E, the multiplexer 620 selects the input bit. Conversely, if the input data is one of a main data symbol M and a known data symbol T, the multiplexer 620 selects the output bit of the pre-coder 610. Thereafter, the selected bit is outputted to the post-decoder 630. Accordingly, the post-decoder 630 post-decodes and outputs the output of the multiplexer 620.

If a main data symbol M or a known data symbol T is inputted to the pre-coder bypass of FIG. 8A, the inputted data symbol sequentially passes through the pre-coder 610 and the post-decoder 630. Therefore, a value equal to that of the input bit is outputted. Accordingly, when the main data or the known data pass through the pre-coder included in the trellis encoder, the main data and the known data are pre-coded. Meanwhile, when the enhanced data symbol is inputted, the input symbol only passes through the post-decoder 630. This indicates that when the symbol passes though the pre-coder of the trellis encoder, the enhanced data symbol bypasses the pre-coder.

Referring to FIG. 8B, the pre-coder bypass according to the present invention includes a pre-coder 640, a multiplexer 650, and a post-decoder 660. Herein, the post-decoder 660 performs an inverse process of the pre-coder 640. The multiplexer 650 selects either an input bit or an output bit of the pre-coder 640 in accordance with the input data symbol type. Then, the multiplexer 650 outputs the selected input bit or output bit to the post-decoder 660. If the input data correspond to one of an enhanced data symbol and a known data symbol, the multiplexer 650 selects the input bit. Conversely, if the input data correspond to a main data symbol, the multiplexer 650 selects the output bit of the pre-coder 640. Thereafter, the selected bit is outputted to the post-decoder 660. Accordingly, the post-decoder 660 post-decodes and outputs the output of the multiplexer 650.

If a main data symbol is inputted to the pre-coder bypass of FIG. 8B, the inputted main data symbol sequentially passes through the pre-coder 640 and the post-decoder 660. Therefore, a value equal to that of the input bit is outputted. Accordingly, when the main data pass through the pre-coder included in the trellis encoder, the main data are pre-coded. Meanwhile, when the enhanced data symbol and the known data symbol are inputted, the input symbols only pass through the post-decoder 660. This indicates that when the symbols pass though the pre-coder of the trellis encoder, the enhanced data symbol and the known data symbol bypass the pre-coder.

Figure 9:
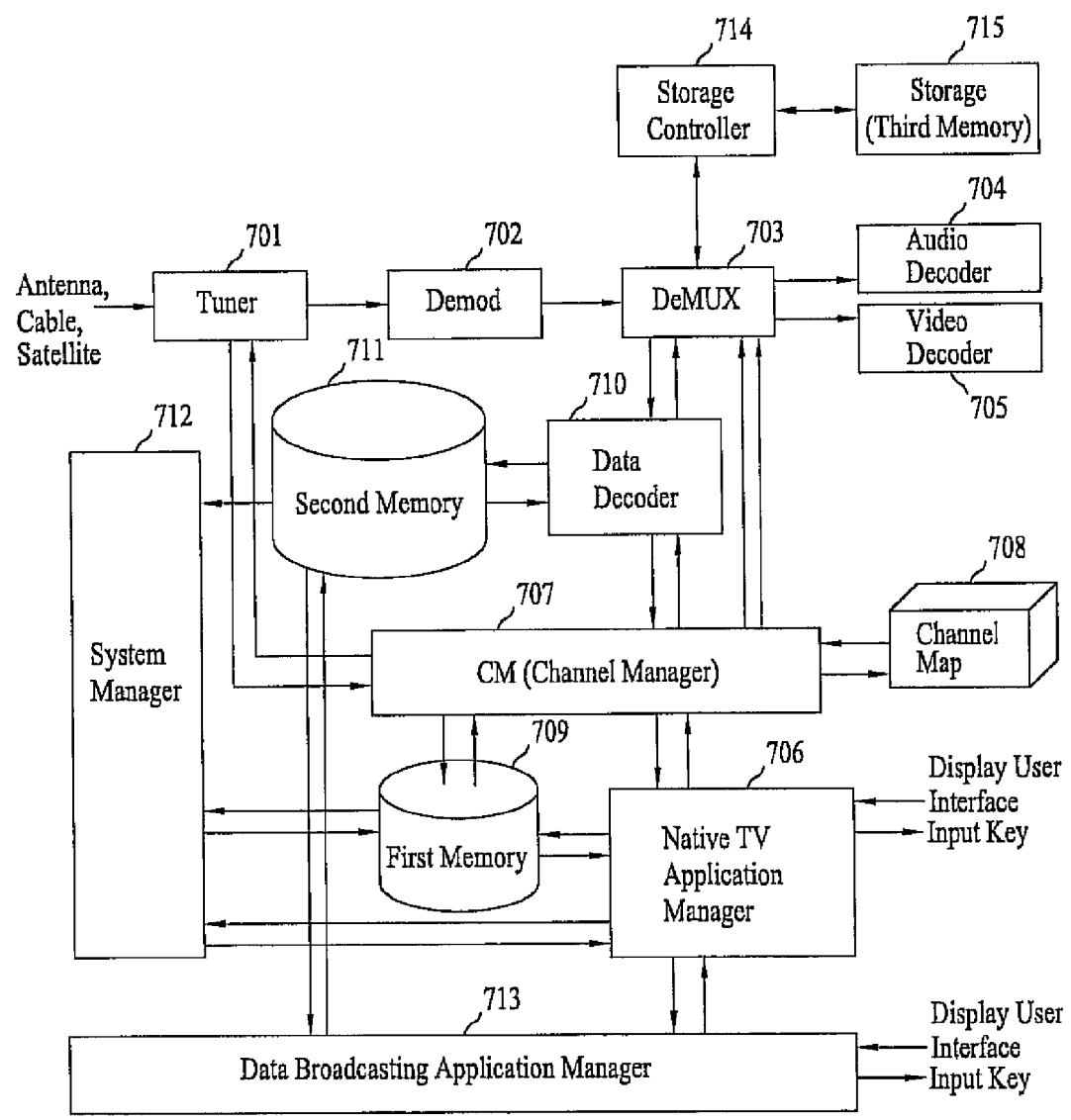
FIG. 9 illustrates a block view showing the structure of a digital broadcast (or television) receiver according to an embodiment of the present invention.

FIG. 9 illustrates a block view showing the structure of a digital broadcast receiver according to an embodiment of the present invention. Referring to FIG. 9, the digital broadcast receiver includes a tuner 701, a demodulator 702, a demultiplexer 703, an audio decoder 704, a video decoder 705, a native TV application manager 706, a channel manager 707, a channel map 708, a first memory 709, a data decoder 710, a second memory 711, a system manager 712, a data broadcasting application manager 713, a storage controller 714, and a third memory 715. Herein, the third memory 715 is a mass storage device, such as a hard disk drive (HDD) or a memory chip. The tuner 701 tunes a frequency of a specific channel through any one of an antenna, cable, and satellite. Then, the tuner 701 down-converts the tuned frequency to an intermediate frequency (IF), which is then outputted to the demodulator 702. At this point, the tuner 701 is controlled by the channel manager 707. Additionally, the result and strength of the broadcast signal of the tuned channel are also reported to the channel manager 707. The data that are being received by the frequency of the tuned specific channel include main data, enhanced data, and table data for decoding the main data and enhanced data.

In the embodiment of the present invention, examples of the enhanced data may include data provided for data service, such as Java application data, Hypertext Markup Language (HTML) application data, Extensible Markup Language (XML) data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the enhanced data may correspond to meta data. For example, the meta data use the XML application so as to be transmitted through a DSM-CC protocol.

Figure 11:
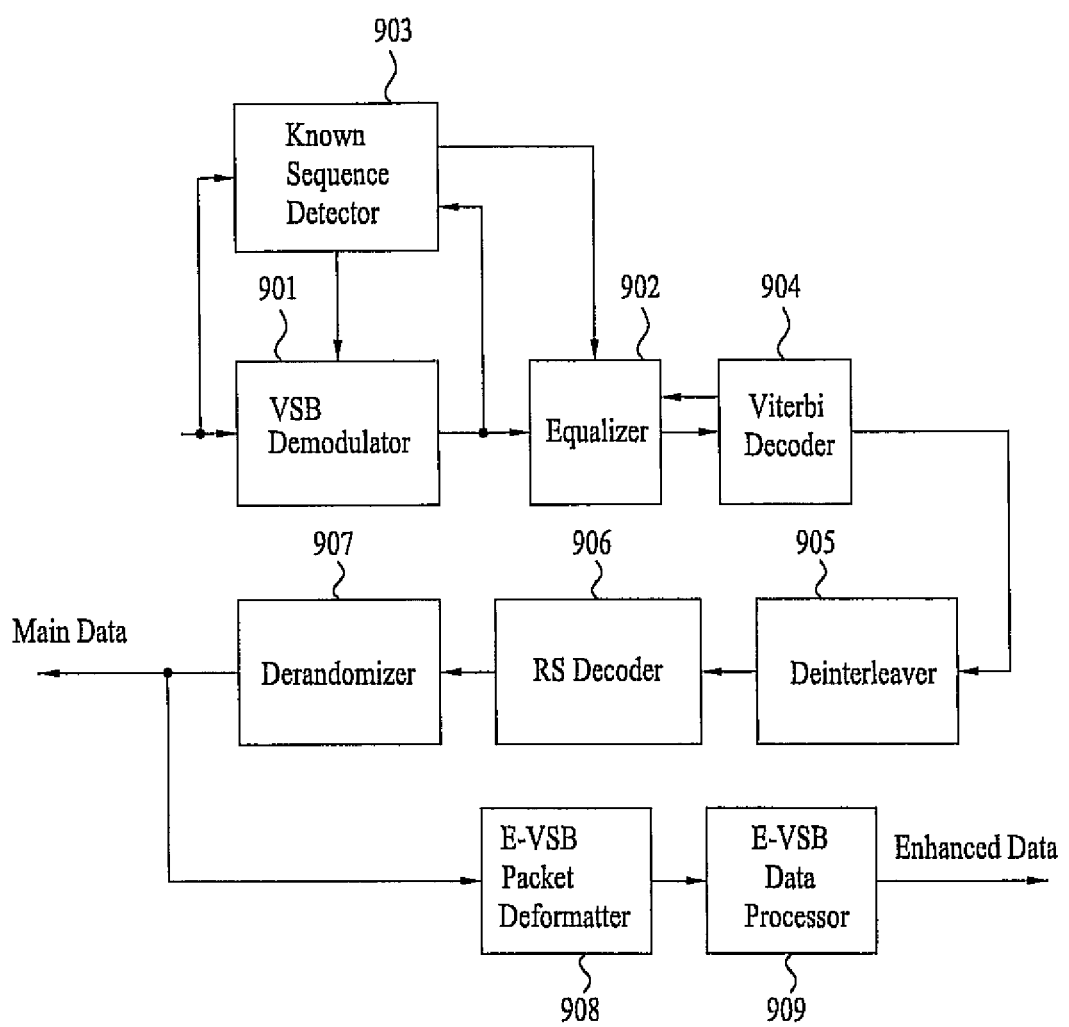
FIG. 11 illustrates a block diagram showing the structure of a demodulator according to the present invention.

The demodulator 702 performs VSB-demodulation and channel equalization on the signal being outputted from the tuner 701, thereby identifying the main data and the enhanced data. Thereafter, the identified main data and enhanced data are outputted in TS packet units. An example of the demodulator 702 is shown in FIG. 11 below. Therefore, the structure and operation of the demodulator will be described in detail in a later process. However, this is merely exemplary and the scope of the present invention is not limited to the example set forth herein. In the embodiment given as an example of the present invention, only the enhanced data packet outputted from the demodulator 702 is inputted to the demultiplexer 703. In this case, the main data packet is inputted to another demultiplexer (not shown) that processes main data packets. Herein, the storage controller 714 is also connected to the other demultiplexer in order to store the main data after processing the main data packets. The demultiplexer of the present invention may also be designed to process both enhanced data packets and main data packets in a single demultiplexer.

The storage controller 714 is interfaced with the demultiplexer so as to control instant recording, reserved (or pre-programmed) recording, time shift, and so on of the enhanced data and/or main data. For example, when one of instant recording, reserved (or pre-programmed) recording, and time shift is set and programmed in the receiving system (or receiver) shown in FIG. 9, the corresponding enhanced data and/or main data that are inputted to the demultiplexer are stored in the third memory 715 in accordance with the control of the storage controller 714. The third memory 715 may be described as a temporary storage area and/or a permanent storage area. Herein, the temporary storage area is used for the time shifting function, and the permanent storage area is used for a permanent storage of data according to the user's choice (or decision).

When the data stored in the third memory 715 need to be reproduced (or played), the storage controller 714 reads the corresponding data stored in the third memory 715 and outputs the read data to the corresponding demultiplexer (e.g., the enhanced data are outputted to the demultiplexer 703 shown in FIG. 9). At this point, according to the embodiment of the present invention, since the storage capacity of the third memory 715 is limited, the compression encoded enhanced data and/or main data that are being inputted are directly stored in the third memory 715 without any modification for the efficiency of the storage capacity. In this case, depending upon the reproduction (or reading) command, the data read from the third memory 715 pass trough the demultiplexer so as to be inputted to the corresponding decoder, thereby being restored to the initial state.

The storage controller 714 may control the reproduction (or play), fast-forward, rewind, slow motion, instant replay functions of the data that are already stored in the third memory 715 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is National Television Standards Committee (NTSC), Phase Alternation Line (PAL), and so on, the storage controller 714 compression encodes the inputted data and stored the compression-encoded data to the third memory 715. In order to do so, the storage controller 714 may include an encoder, wherein the encoder may be embodied as one of software, middleware, and hardware. Herein, an MPEG encoder may be used as the encoder according to an embodiment of the present invention. The encoder may also be provided outside of the storage controller 714.

Meanwhile, in order to prevent illegal duplication (or copies) of the input data being stored in the third memory 715, the storage controller 714 scrambles the input data and stores the scrambled data in the third memory 715. Accordingly, the storage controller 714 may include a scramble algorithm for scrambling the data stored in the third memory 715 and a descramble algorithm for descrambling the data read from the third memory 715. Herein, the definition of scramble includes encryption, and the definition of descramble includes decryption. The scramble method may include using an arbitrary key (e.g., control word) to modify a desired set of data, and also a method of mixing signals.

Meanwhile, the demultiplexer 703 receives the real-time data outputted from the demodulator 702 or the data read from the third memory 715 and demultiplexes the received data. In the example given in the present invention, the demultiplexer 703 performs demultiplexing on the enhanced data packet. Therefore, in the present invention, the receiving and processing of the enhanced data will be described in detail. It should also be noted that a detailed description of the processing of the main data will be omitted for simplicity starting from the description of the demultiplexer 703 and the subsequent elements.

The demultiplexer 703 demultiplexes enhanced data and program specific information/program and system information protocol (PST/PSIP) tables from the enhanced data packet inputted in accordance with the control of the data decoder 710. Thereafter, the demultiplexed enhanced data and PSI/PSIP tables are outputted to the data decoder 710 in a section format. In order to extract the enhanced data from the channel through which enhanced data are transmitted and to decode the extracted enhanced data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which Program Clock Reference (PCR) is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/Directed Channel Change Selection Code Table (DCCSCT) transmits information associated with automatic (or direct) channel change. And, the MGT transmits the versions and PID information of the above-mentioned tables included in the PSIP.

Each of the above-described tables included in the PSI/PSIP is configured of a basic unit referred to as a "section", and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PISP, or a combination of tables included in both the PSI and the PSIP. In order to parse and decode the data for the data service, at least one of the PAT and PMT included in the PSI, and the VCT included in the PSIP is required. For example, the PAT may include the system information for transmitting the data corresponding to the data service, and the PID of the PMT corresponding to the data service data (or program number). The PMT may include the PID of the TS packet used for transmitting the data service data. The VCT may include information on the virtual channel for transmitting the data service data, and the PID of the TS packet for transmitting the data service data.

Meanwhile, depending upon the embodiment of the present invention, a Digital Video Broadcasting-Service Information (DVB-SI) may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that are used during the Integrated Receiver/Decoder (IRD) set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, the enhanced data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95' is assigned as the value of a stream_type field included in the service location descriptor of the PMT or the VCT. More specifically, when the PMT or VCT stream_type field value is '0x95', the receiving system may acknowledge that data broadcasting including enhanced data (i.e., the enhanced data) is being received. At this point, the enhanced data may be transmitted by a data carousel method. The data carousel method corresponds to repeatedly transmitting identical data on a regular basis.

At this point, according to the control of the data decoder 710, the demultiplexer 703 performs section filtering, thereby discarding repetitive sections and outputting only the non-repetitive sections to the data decoder 710. The demultiplexer 703 may also output only the sections configuring desired tables (e.g., VCT) to the data decoder 710 by section filtering. Herein, the VCT may include a specific descriptor for the enhanced data. However, the present invention does not exclude the possibilities of the enhanced data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 703 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 703 may output only an application information table (AIT) to the data decoder 710 by section filtering. The AIT includes information on an application being operated in the receiver for the data service. The AIT may also be referred to as an Extended Application Information Table (XAIT), and an Application Management Table (AMT). Therefore, any table including application information may correspond to the following description. When the AIT is transmitted, a value of '0x05' may be assigned to a stream type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 711 by the data decoder 710.

The data decoder 710 parses the DSM-CC section configuring the demultiplexed enhanced data. Then, the enhanced data corresponding to the parsed result are stored as a database in the second memory 711. The data decoder 710 groups a plurality of sections having the same table identification (table_id) so as to configure a table, which is then parsed. Thereafter, the parsed result is stored as a database in the second memory 711. At this point, by parsing data and/or sections, the data decoder 710 reads all of the remaining actual section data that are not section-filtered by the demultiplexer 703. Then, the data decoder 710 stores the read data to the second memory 711. The second memory 711 corresponds to a table and data carousel database storing system information parsed from tables and enhanced data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

When the VCT is parsed, information on the virtual channel to which enhanced data are transmitted may be obtained. The obtained application identification information, service component identification information, and service information corresponding to the data service may either be stored in the second memory 711 or be outputted to the data broadcasting application manager 713. In addition, reference may be made to the application identification information, service component identification information, and service information in order to decode the data service data. Alternatively, such information may also prepare the operation of the application program for the data service. Furthermore, the data decoder 710 controls the demultiplexing of the system information table, which corresponds to the information table associated with the channel and events. Thereafter, an A.V PID list may be transmitted to the channel manager 707.

The channel manager 707 may refer to the channel map 708 in order to transmit a request for receiving system-related information data to the data decoder 710, thereby receiving the corresponding result. In addition, the channel manager 707 may also control the channel tuning of the tuner 701. Furthermore, the channel manager 707 may directly control the demultiplexer 703, so as to set up the audio/video (A/V) PID, thereby controlling the audio decoder 704 and the video decoder 705. The audio decoder 704 and the video decoder 705 may respectively decode and output the audio data and video data demultiplexed from the main data packet. Alternatively, the audio decoder 704 and the video decoder 705 may respectively decode and output the audio data and video data demultiplexed from the enhanced data packet. Meanwhile, when the enhanced data include data service data, and also audio data and video data, it is apparent that the audio data and video data demultiplexed by the demultiplexer 703 are respectively decoded by the audio decoder 704 and the video decoder 705. For example, an audio-coding (AC)-3 decoding algorithm may be applied to the audio decoder 704, and a MPEG-2 decoding algorithm may be applied to the video decoder 705.

Meanwhile, the native TV application manager 706 operates a native application program stored in the first memory 709, thereby performing general functions such as channel change. The native application program refers to software stored in the receiving system upon shipping of the product. More specifically, when a user request (or command) is transmitted to the receiving system through a user interface (UI), the native TV application manger 706 displays the user request on a screen through a graphic user interface (GUI), thereby responding to the user's request. The user interface receives the user request through an input device, such as a remote controller, a key pad, a jog controller, an a touch-screen provided on the screen, and then outputs the received user request to the native TV application manager 706 and the data broadcasting application manager 713. Furthermore, the native TV application manager 706 controls the channel manager 707, thereby controlling channel-associated, such as the management of the channel map 708, and controlling the data decoder 710. The native TV application manager 706 also controls the GUI of the overall receiving system, thereby storing the user request and status of the receiving system in the first memory 709 and restoring the stored information.

The channel manager 707 controls the tuner 701 and the data decoder 710, so as to managing the channel map 708 so that it can respond to the channel request made by the user. More specifically, channel manager 707 sends a request to the data decoder 710 so that the tables associated with the channels that are to be tuned are parsed. The results of the parsed tables are reported to the channel manager 707 by the data decoder 710. Thereafter, based on the parsed results, the channel manager 707 updates the channel map 708 and sets up a PID in the demultiplexer 703 for demultiplexing the tables associated with the data service data from the enhanced data.

The system manager 712 controls the booting of the receiving system by turning the power on or off. Then, the system manager 712 stores Read Only Memory (ROM) images (including downloaded software images) in the first memory 709. More specifically, the first memory 709 stores management programs such as operating system (OS) programs required for managing the receiving system and also application program executing data service functions. The application program is a program processing the data service data stored in the second memory 711 so as to provide the user with the data service. If the data service data are stored in the second memory 711, the corresponding data service data are processed by the above-described application program or by other application programs, thereby being provided to the user. The management program and application program stored in the first memory 709 may be updated or corrected to a newly downloaded program. Furthermore, the storage of the stored management program and application program is maintained without being deleted even if the power of the system is shut down. Therefore, when the power is supplied the programs may be executed without having to be newly downloaded once again.

The application program for providing data service according to the present invention may either be initially stored in the first memory 709 upon the shipping of the receiving system, or be stored in the first 709 after being downloaded. The application program for the data service (i.e., the data service providing application program) stored in the first memory 709 may also be deleted, updated, and corrected. Furthermore, the data service providing application program may be downloaded and executed along with the data service data each time the data service data are being received.

When a data service request is transmitted through the user interface, the data broadcasting application manager 713 operates the corresponding application program stored in the first memory 709 so as to process the requested data, thereby providing the user with the requested data service. And, in order to provide such data service, the data broadcasting application manager 713 supports the graphic user interface (GUI). Herein, the data service may be provided in the form of text (or short message service (SMS)), voice message, still image, and moving image. The data broadcasting application manager 713 may be provided with a platform for executing the application program stored in the first memory 709. The platform may be, for example, a Java virtual machine for executing the Java program. Hereinafter, an example of the data broadcasting application manager 713 executing the data service providing application program stored in the first memory 709, so as to process the data service data stored in the second memory 711, thereby providing the user with the corresponding data service will now be described in detail.

Assuming that the data service corresponds to a traffic information service, the data service according to the present invention is provided to the user of a receiver that is not equipped with an electronic map and/or a Global Positioning System (GPS) in the form of at least one of a text (or short message service (SMS)), a voice message, a graphic message, a still image, and a moving image. In this case, is a GPS module is mounted on the receiving system shown in FIG. 9, the GPS module receives satellite signals transmitted from a plurality of low earth orbit satellites and extracts the current position (or location) information (e.g., longitude, latitude, altitude), thereby outputting the extracted information to the data broadcasting application manager 713.

At this point, it is assumed that the electronic map including information on each link and nod and other diverse graphic information are stored in one of the second memory 711, the first memory 709, and another memory that is not shown. More specifically, according to the request made by the data broadcasting application manager 713, the data service data stored in the second memory 711 are read and inputted to the data broadcasting application manager 713. The data broadcasting application manager 713 translates (or deciphers) the data service data read from the second memory 711, thereby extracting the necessary information according to the contents of the message and/or a control signal.

Figure 10:
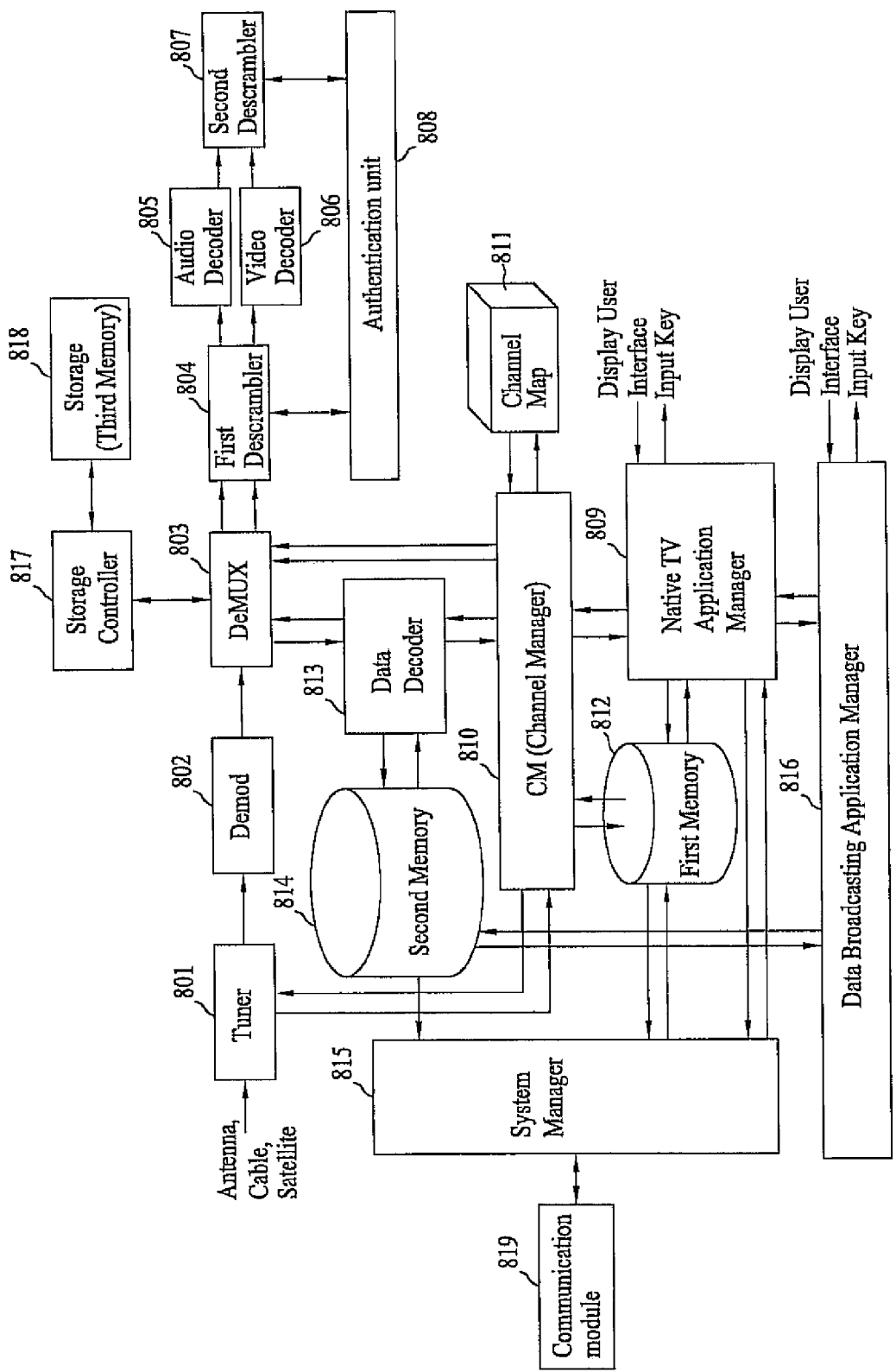
FIG. 10 illustrates a block view showing the structure of a digital broadcast (or television) receiver according to another embodiment of the present invention.

FIG. 10 illustrates a block view showing the structure of a digital broadcast (or television) receiver according to another embodiment of the present invention. Referring to FIG. 10, the digital broadcast receiver includes a tuner 801, a demodulator 802, a demultiplexer 803, a first descrambler 804, an audio decoder 805, a video decoder 806, a second descrambler 807, an authentication unit 808, a native TV application manager 809, a channel manager 810, a channel map 811, a first memory 812, a data decoder 813, a second memory 814, a system manager 815, a data broadcasting application manager 816, a storage controller 817, a third memory 818, and a telecommunication module 819. Herein, the third memory 818 is a mass storage device, such as a hard disk drive (HDD) or a memory chip. Also, during the description of the digital broadcast (or television) receiver shown in FIG. 10, the components that are identical to those of the digital broadcast receiver of FIG. 9 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 804 and 807, and the authentication means will be referred to as an authentication unit 808. Such naming of the corresponding components is merely exemplary and is not limited to the terms suggested in the description of the present invention. For example, the units may also be referred to as a decryptor. Although FIG. 10 illustrates an example of the descramblers 804 and 807 and the authentication unit 808 being provided inside the receiving system, each of the descramblers 804 and 807 and the authentication unit 808 may also be separately provided in an internal or external module. Herein, the module may include a slot type, such as a secure digital (SD) or compact flash (CF) memory, a memory stick type, a universal serial bus (USB) type, and so on, and may be detachably fixed to the receiving system.

As described above, when the authentication process is performed successfully by the authentication unit 808, the scrambled broadcasting contents are descrambled by the descramblers 804 and 807, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 808 and the descramblers 804 and 807 will now be described in detail. The receiving system receives the scrambled broadcasting contents through the tuner 801 and the demodulator 802. Then, the system manager 815 decides whether the received broadcasting contents have been scrambled. Herein, the demodulator 802 may be included as a demodulating means according to an embodiment of the present invention as described in FIG. 11. However, the present invention is not limited to the examples given in the description set forth herein. If the system manager 815 decides that the received broadcasting contents have been scrambled, then the system manager 815 controls the system to operate the authentication unit 808. As described above, the authentication unit 808 performs an authentication process in order to decide whether the receiving system according to the present invention corresponds to a legitimate host entitled to receive the paid broadcasting service. Herein, the authentication process may vary in accordance with the authentication methods.

For example, the authentication unit 808 may perform the authentication process by comparing an Internet Protocol (IP) address of an IP datagram within the received broadcasting contents with a specific address of a corresponding host. At this point, the specific address of the corresponding receiving system (or host) may be a Media Access Control (MAC) address. More specifically, the authentication unit 808 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 808 performs the authentication process by determining the conformity between the address of the corresponding receiving system and the system information of the receiving system that is mapped with the IP address. In other words, if the authentication unit 808 determines that the two types of information conform to one another, then the authentication unit 808 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the Conditional Access System (CAS) information, mode information, message position information, that are applied to the scrambling of the broadcasting contents are transmitted through a corresponding data header or another data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiver-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 808 of the receiving system extracts the identification information of the receiving system and the identification information included in the EMM of the broadcasting service that is being received. Then, the authentication unit 808 determines whether the identification information conform to each other, so as to perform the authentication process. More specifically, if the authentication unit 808 determines that the information conform to each other, then the authentication unit 808 eventually determines that the receiving system is entitled to receive the request broadcasting service.

In yet another example, the authentication unit 808 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 815 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 815 transmits the payment information to the remote transmitting system through the telecommunication module 819.

The authentication unit 808 authenticates the corresponding receiving system and/or the external module. Then, if the authentication process is successfully completed, the authentication unit 808 certifies the corresponding receiving system and/or the external module as a legitimate system and/or module entitled to receive the requested paid broadcasting service. In addition, the authentication unit 808 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 808, the receiving system may descramble the scrambled broadcasting contents received from the transmitting system. At this point, the descrambling process is performed by the first and second descramblers 804 and 807. Herein, the first and second descramblers 804 and 807 may be included in an internal module or an external module of the receiving system.

The receiving system is also provided with a common interface for communicating with the external module including the first and second descramblers 804 and 807, so as to perform the descrambling process. More specifically, the first and second descramblers 804 and 807 may be included in the module or in the receiving system in the form of hardware, middleware or software. Herein, the descramblers 804 and 807 may be included in any one of or both of the module and the receiving system. If the first and second descramblers 804 and 807 are provided inside the receiving system, it is advantageous to have the transmitting system (i.e., at least any one of a service provider and a broadcast station) scramble the corresponding data using the same scrambling method.

Alternatively, if the first and second descramblers 804 and 807 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide Conditional Access (CA) functions, which are uniquely and only provided by each transmitting systems, and functions related to each service that is to be provided to the user. The common interface enables the various external modules and the system manager 815, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advance is inserted in the receiving system, the receiving system receives and loads the CAS software from the memory card so as to perform the authentication process. In this example, the CAS software is read out from the memory card and stored in the first memory 812 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 808 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 808 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 815, then the memory card is verified and determined to be a normal memory card that may be used in the receiving system. At this point, the CAS software may either be installed in the first memory 812 upon the shipping of the present invention, or be downloaded to the first memory 812 from the transmitting system or the module or memory card, as described above. Herein, the descrambling function may be operated by the data broadcasting application manger 816 as an application program.

Thereafter, the CAS software parses the EMM/ECM packets outputted from the demultiplexer 803, so as to verify whether the receiving system is entitled to receive the corresponding data, thereby obtaining the information required for descrambling (i.e., the CW) and providing the obtained CW to the descramblers 804 and 807. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 804 and 807. Each of the descramblers 804 and 807 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiver, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 804 and 807 may be included in the module either in the form of hardware or in the form of software. In this case, the scrambled data that being received are descrambled by the module and then demodulated. Also, if the scrambled data that are being received are stored in the third memory 818, the received data may be descrambled and then stored, or stored in the memory at the point of being received and then descrambled later on prior to being played (or reproduced). Thereafter, in case scramble/descramble algorithms are provided in the storage controller 817, the storage controller 817 scrambles the data that are being received once again and then stores the re-scrambled data to the third memory 818.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 819. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 819 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information).

Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 819 may also be configured. Also, the PDU may be configured in the Java application of the receiving system and then outputted to the telecommunication module 819. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a Wireless Application Protocol (WAP), Code-Division Multiple Access (CDMA) 1× Evolution-Data Optimized (EV-DO), which can be connected through a mobile telecommunication base station, such as CDMA and Global System for Mobile communication (GSM), and also provided with a wireless local area network (LAN), mobile internet, WiBro, WiMax, which can be connected through an access point. The above-described receiving system corresponds to the system that is not equipped with a telecommunication function. However, a receiving system equipped with telecommunication function does not require the telecommunication module 819.

The broadcasting data being transmitted and received through the above-described wireless data network may include data required for performing the function of limiting data reception. Meanwhile, the demultiplexer 803 receives either the real-time data outputted from the demodulator 802 or the data read from the third memory 818, thereby performing demultiplexing. In this embodiment of the present invention, the demultiplexer 803 performs demultiplexing on the enhanced data packet. Similar process steps have already been described earlier in the description of the present invention. Therefore, a detailed of the process of demultiplexing the enhanced data will be omitted for simplicity.

The first descrambler 804 receives the demultiplexed signals from the demultiplexer 803 and then descrambles the received signals. At this point, the first descrambler 804 may receive the authentication result received from the authentication unit 808 and other data required for the descrambling process, so as to perform the descrambling process. The audio decoder 805 and the video decoder 806 receive the signals descrambled by the first descrambler 804, which are then decoded and outputted. Alternatively, if the first descrambler 804 did not perform the descrambling process, then the audio decoder 805 and the video decoder 806 directly decode and output the received signals. In this case, the decoded signals are received and then descrambled by the second descrambler 807 and processed accordingly.

Meanwhile, the demodulator 702 and 802 of FIG. 9 and FIG. 10 uses the known data information inserted in an enhanced data section and transmitted by the transmitting system, so as to restore the carrier wave synchronization, restore the frame synchronization, and perform channel equalization, thereby enhancing the receiving performance of the present invention. FIG. 11 illustrates a block diagram showing the structure of the demodulator. Referring to FIG. 11, the demodulator includes a VSB demodulator 901, an equalizer 902, a known data detector 903, a Viterbi decoder 904, a data deinterleaver 905, a RS decoder/non-systematic RS parity remover 906, and a derandomizer 907. The digital broadcast receiver further includes an E-VSB packet deformatter 908, and an E-VSB data processor 909.

More specifically, the output of tuner 701 (or 801) inputs to the VSB demodulator 901 and the known data detector 902. The VSB demodulator 901 demodulates the tuned channel frequency so as to perform carrier wave recovery and timing recovery, thereby creating a baseband signal. Then, the VSB demodulator 901 outputs the created baseband signal to the equalizer 902 and the known data detector 903. The equalizer 902 compensates for any channel distortion included in the demodulated signal. Thereafter, the equalizer 902 outputs the processed signal to the Viterbi decoder 904.

At this point, the known data detector 903 detects the known data symbol sequence inserted from the transmitter from the input/output data of the VSB demodulator 901 (i.e., the data prior to demodulation or the data after demodulation). Then, the known data detector 903 outputs the detected sequence to the VSB demodulator 901 and the equalizer 902. When the VSB demodulator 901 uses the known data symbol sequence during the timing recovery or the carrier wave recovery, the demodulating performance may be enhanced. Similarly, when the equalizer 902 uses the known data symbol sequence, the equalization performance may be enhanced.

The Viterbi decoder 904 Viterbi-decodes the main symbol and the enhanced data symbol outputted from the equalizer 902, so as to convert the symbols into data bytes, thereby outputting the newly converted data bytes to the deinterleaver 905. The 8-level value decided by the Viterbi decoder 904 is provided to the equalizer 902 so as to enhance the equalizing performance. The deinterleaver 905 performs the inverse operation of the data interleaver of the transmitting system and, then, outputs the processed data to the RS decoder/non-systematic RS parity remover 906. If the received packet is the main data packet, the RS decoder/non-systematic RS parity remover 906 RS-decodes the received packet. Alternatively, if the received packet is the enhanced data packet, the RS decoder/non-systematic RS parity remover 906 removes the non-systematic RS parity byte from the received packet. Thereafter, the processed packet is outputted to the derandomizer 907.

The derandomizer 907 performs an inverse process of the randomizer so as to process the output of the RS decoder/non-systematic RS parity remover 906. Subsequently, the derandomizer 907 inserts a MPEG synchronization data byte at the beginning of each packet and outputs the processed packet in 188-byte units. The output of the derandomizer 907 is outputted to the main MPEG decoder (not shown) and to the E-VSB packet deformatter 908 at the same time.

Meanwhile, the E-VSB packet deformatter 908 removes the 188-byte unit main data packet from the data outputted from the derandomizer 907. Subsequently, the E-VSB packet deformatter 908 removes (or discards) the 4-byte MPEG header byte and the known data byte that have been inserted by the transmitting system, and also removes the null bit or repetition bit that has been inserted for the byte expansion from the processed data. Thereafter, the E-VSB packet deformatter 908 outputs the processed data to the E-VSB data processor 909. The E-VSB data processor 909 performs an inverse process of the E-VSB pre-processor 101 of the transmitting system, so as to process the data outputted from the E-VSB packet deformatter 908. Subsequently, the E-VSB data processor 909 outputs the final output data.

As described above, the digital broadcast transmitting/receiving system and the method of processing data according to the present invention have the following advantages. More specifically, the digital broadcast transmitting/receiving system and the method of processing data according to the present invention is highly protected against (or resistant to) any error that may occur when transmitting supplemental data through a channel. And, the present invention is also highly compatible to the conventional VSB receiving system. Moreover, the present invention may also receive the supplemental data without any error even in channels having severe ghost effect and noise.

Additionally, by inserting known data in a specific position of the data domain and transmitting the processed data, the receiving performance of the digital broadcast receiving system liable to a frequent change in channel may be enhanced. The present invention is even more effective when applied to mobile and portable receivers, which are also liable to a frequent change in channel and which require protection (or resistance) against intense noise. Finally, a coding process coding is additionally performed at a coding rate of ¾ on the enhanced data symbol, which bypasses the pre-coder so as to be outputted. Thus, the problems of noise and ghost effect in the channel may be enhanced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A digital television (DTV) transmitting system for processing digital broadcast data, the DTV transmitting system comprising:
   a randomizer for randomizing enhanced data;
   an encoder for encoding each bit of the randomized enhanced data at a coding rate of ½ in order to output data symbols;
   a symbol to byte converter for converting the data symbols to data bytes;
   a deinterleaver for deinterleaving the data bytes;
   a Reed-Solomon (RS) encoder for RS-coding enhanced data packets including the deinterleaved data bytes to add RS parity data;
   a data interleaver for interleaving data of the RS-coded enhanced data packets, wherein the interleaved data comprise a known data sequence;
   a trellis encoder for trellis coding the interleaved data at a coding rate of ⅔, wherein at least one memory of the trellis encoder is initialized at a start of the known data sequence; and a transmitting unit for transmitting a digital broadcast signal including the trellis-encoded data.

2. The DTV transmitting system of claim 1, wherein:
the digital broadcast signal further includes main data; and
the encoder for encoding each bit of the randomized enhanced data at the coding rate of ½ does not encode the main data.

3. A method of processing digital broadcast data in a digital television (DTV) transmitting system, the method comprising:
  randomizing enhanced data;
  encoding each bit of the randomized enhanced data at a coding rate of ½ in order to output data symbols;
  converting the data symbols to data bytes;
  deinterleaving the data bytes;
  Reed-Solomon (RS) coding enhanced data packets including the deinterleaved data bytes to add RS parity data;
  interleaving data of the RS-coded enhanced data packets, wherein the interleaved data comprise a known data sequence;
  trellis encoding the interleaved data at a coding rate of ⅔ by a trellis encoder, wherein at least one memory of the trellis encoder is initialized at a start of the known data sequence; and
  transmitting a digital broadcast signal including the trellis-encoded data.

4. The method of claim 3, wherein:
the digital broadcast signal further includes main data; and
encoding each bit of the randomized enhanced data at the coding rate of ½ is not performed on the main data.

5. A digital television (DTV) receiving system for processing digital broadcast data, the DTV receiver comprising:
  a tuner for receiving a digital broadcast signal, wherein the digital broadcast signal has been processed in a DTV transmitter by:
    randomizing enhanced data;
    encoding each bit of the randomized enhanced data at a coding rate of ½ in order to output data symbols;
    converting the data symbols to data bytes;
    deinterleaving the data bytes;
    Reed-Solomon (RS) coding enhanced data packets including the deinterleaved data bytes to add RS parity data;
    interleaving data of the RS-coded enhanced data packets, wherein the interleaved data comprise a known data sequence; and
    trellis encoding the interleaved data at a coding rate of ⅔ by a trellis encoder, wherein at least one memory of the trellis encoder is initialized at a start of the known data sequence;
  a first decoder for inner decoding the digital broadcast signal; and
  a second decoder for outer decoding the inner-decoded digital broadcast signal.

6. The DTV receiving system of claim 5, wherein:
the digital broadcast signal further includes main data; and
encoding each bit of the randomized enhanced data at the coding rate of ½ is not performed on the main data.

7. A method of processing digital broadcast data in a digital television (DTV) receiving system, the method comprising:
  receiving a digital broadcast signal, wherein the digital broadcast signal has been processed in a DTV transmitter by:
    randomizing enhanced data;
    encoding each bit of the randomized enhanced data at a coding rate of ½ in order to output data symbols;
    converting the data symbols to data bytes;
    deinterleaving the data bytes;
    Reed-Solomon (RS) coding enhanced data packets including the deinterleaved data bytes to add RS parity data;
    interleaving data of the RS-coded enhanced data packets, wherein the interleaved data comprise a known data sequence; and
    trellis encoding the interleaved data at a coding rate of ⅔ by a trellis encoder, wherein at least one memory of the trellis encoder is initialized at a start of the known data sequence;
  inner decoding the digital broadcast signal; and
  outer decoding the inner-decoded digital broadcast signal.

8. The method of claim 7, wherein:
the digital broadcast signal further includes main data; and
encoding each bit of the randomized enhanced data at the coding rate of ½ is not performed on the main data.

* * * * *